US009054486B2

(12) United States Patent
Hasegawa et al.

(10) Patent No.: US 9,054,486 B2
(45) Date of Patent: Jun. 9, 2015

(54) OPTICAL AMPLIFIER DEVICE

(71) Applicant: FURUKAWA ELECTRIC CO., LTD., Chiyoda-ku, Tokyo (JP)

(72) Inventors: Hideaki Hasegawa, Tokyo (JP); Masaki Funabashi, Tokyo (JP); Kazuaki Kiyota, Tokyo (JP); Takeshi Akutsu, Tokyo (JP); Noriyuki Yokouchi, Tokyo (JP); Kazutaka Nara, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 23 days.

(21) Appl. No.: 14/089,661

(22) Filed: Nov. 25, 2013

(65) Prior Publication Data

US 2014/0078580 A1  Mar. 20, 2014

Related U.S. Application Data

(63) Continuation of application No. PCT/JP2012/005326, filed on Aug. 24, 2012.

(30) Foreign Application Priority Data

Sep. 8, 2011  (JP) ................................. 2011-196389

(51) Int. Cl.
*H01S 5/00* (2006.01)
*H01S 5/042* (2006.01)
(Continued)

(52) U.S. Cl.
CPC ............... *H01S 5/0425* (2013.01); *H01S 5/026* (2013.01); *H01S 5/5018* (2013.01); *H01S 5/2231* (2013.01); *H01S 5/5036* (2013.01); *H01S 5/2205* (2013.01); *H01S 5/0261* (2013.01); *H01S 5/125* (2013.01)

(58) Field of Classification Search
CPC ..... H01S 5/026; H01S 5/5009; H01S 5/5018; H01S 5/5027; H01S 5/2205
See application file for complete search history.

(56) References Cited

U.S. PATENT DOCUMENTS

2003/0179441 A1\*  9/2003  Pechstedt et al. .............. 359/337
2008/0031566 A1    2/2008  Matsubara et al.
(Continued)

FOREIGN PATENT DOCUMENTS

JP  02127624 A  \*  5/1990  ............... G02F 1/35
JP    864904 A      3/1996
(Continued)

OTHER PUBLICATIONS

International Search Report mailed Dec. 4, 2012, corresponds to PCT/JP2012/005326.
(Continued)

*Primary Examiner* — Eric Bolda
(74) *Attorney, Agent, or Firm* — Lowe Hauptman & Ham, LLP

(57) ABSTRACT

An optical amplifier device comprising an input/output section that inputs incident light and outputs emission light; a polarized light splitting section that causes a polarized light component of the incident light input from the input/output section to branch, and outputs first polarization mode light having a first polarization and second polarization mode light having a second polarization different from the first polarization; a polarization converting section that receives the first polarization mode light, converts the first polarization to the second polarization, and outputs first polarization converted light; and an optical amplifying section that amplifies the first polarization converted light input to one end of a waveguide, outputs the resulting amplified first polarization converted light from another end of the waveguide, amplifies the second polarization mode light input to the other end of the waveguide, and outputs the resulting amplified second polarization mode light from the one end of the waveguide.

7 Claims, 15 Drawing Sheets

(51) Int. Cl.
  *H01S 5/50* (2006.01)
  *H01S 5/026* (2006.01)
  *H01S 5/223* (2006.01)
  *H01S 5/22* (2006.01)
  *H01S 5/125* (2006.01)

(56) References Cited

U.S. PATENT DOCUMENTS

2008/0240645 A1    10/2008   Funabashi et al.
2010/0245987 A1*   9/2010    Hasegawa et al. ......... 359/341.3

FOREIGN PATENT DOCUMENTS

| JP | 2003207668 A | 7/2003 |
|---|---|---|
| JP | 2006186253 A | 7/2006 |
| JP | 2007103517 A | 4/2007 |
| JP | 2008250019 A | 10/2008 |
| JP | 2008275708 A | 11/2008 |
| WO | 2006013928 A1 | 2/2006 |

OTHER PUBLICATIONS

Morito, Ken et al. Record High Saturation Power (+22 dBm) and Low Noise Figure (5.7 dB) Polarization-Insensitive SOA Module, IEEE Photonics Technology Letters, 2005, vol. 17, Issue 6, p. 1298-1300.

M. Itoh, Y. Shibata, T. Kakitsuka, Y. Kadota, Y. Tohmori, "Polarization-insensitive SOA with a strained bulk active layer for network device application", IEEE Photonics Technology Letters, vol. 14, Issue 6, 765-767. (2002).

International Preliminary Report on Patentability mailed Mar. 20, 2014, corresponds to PCT/JP2012/005326.

* cited by examiner

OPTICAL AMPLIFIER DEVICE

The contents of the following patent applications are incorporated herein by reference:
No. 2011-196389 filed in Japan on Sep. 8, 2011, and
No. PCT/JP2012-005326 filed on Aug. 24, 2012.

BACKGROUND

1. Technical Field

The present invention relates to an optical amplifier device.

2. Related Art

An optical amplifier device is known that uses a polarization diversity circuit to split input light into TE polarized light and TM polarized light, keep the TE polarized light as-is, convert the TM polarized light into TE polarized light, and input the TE polarized light resulting from the conversion into an SOA (Semiconductor Optical Amplifier), such as shown in Non-Patent Document 1.

Non-Patent Document 1: K. Morito and S. Tanaka, "Record High Saturation Power (+22 dBm) and Low Noise FIG. 5.7dB) Polarization-Insensitive SOA Module", IEEE PHOTONICS TECHNOLOGY LETTERS, 17, 6, 1298-1300, (2005)

The gain of the light in the SOA differs for the TE polarized light and the TM polarized light. With an optical amplifier device that uses a polarity diversity circuit, the TM polarized light is converted into TE polarized light and then input to the SOA. As a result, the difference in optical gain caused by the polarization direction can be decreased. However, the gain of the SOA also depends on the intensity of the light input to the SOA. Therefore, in the polarity diversity circuit, if there is a difference between the intensity of the light that is input to the SOA after being converted from TM polarized light to TE polarized light and the intensity of the light input to the SOA as the split TE polarized light, there is also a difference in gain between these two lights.

The difference in gain caused by the polarization direction is referred to as PDG (Polarized Dependent Gain). When the polarization direction of signal light input to an optical amplifier device changes randomly, PDG occurs and there is fluctuation in the intensity of the light output from the optical amplifier device, which causes signal error. Accordingly, in order to reduce the signal error, it is necessary to decrease the PDG.

SUMMARY

Therefore, it is an object of an aspect of the innovations herein to provide an optical amplifier device, which is capable of overcoming the above drawbacks accompanying the related art. The above and other objects can be achieved by combinations described in the claims. According to a first aspect of the present invention, provided is an optical amplifier device comprising an input/output section that inputs incident light and outputs emission light; a polarized light splitting section that causes a polarized light component of the incident light input from the input/output section to branch, and outputs first polarization mode light having a first polarization and second polarization mode light having a second polarization that is different from the first polarization; a polarization converting section into which is input the first polarization mode light, the polarization section converting the first polarization to the second polarization and outputting first polarization converted light; and an optical amplifying section that amplifies the first polarization converted light input to one end of a waveguide, outputs the resulting amplified first polarization converted light from another end of the waveguide, amplifies the second polarization mode light input to the other end of the waveguide, and outputs the resulting amplified second polarization mode light from the one end of the waveguide. An absolute value of a change in gain per unit intensity of the light input to the optical amplifying section is no greater than 0.16 dB/dBm. The optical amplifying section includes an active layer that propagates the first polarization converted light and the second polarization mode light, and an electrode that injects carriers into the active layer. With $\Gamma$ representing a confinement coefficient that is a ratio between light confined in the active layer and light in the optical amplifying section and L representing length of the electrode in micrometers, the expression $\Gamma \times L < 1500\%\,\mu m$ is satisfied.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
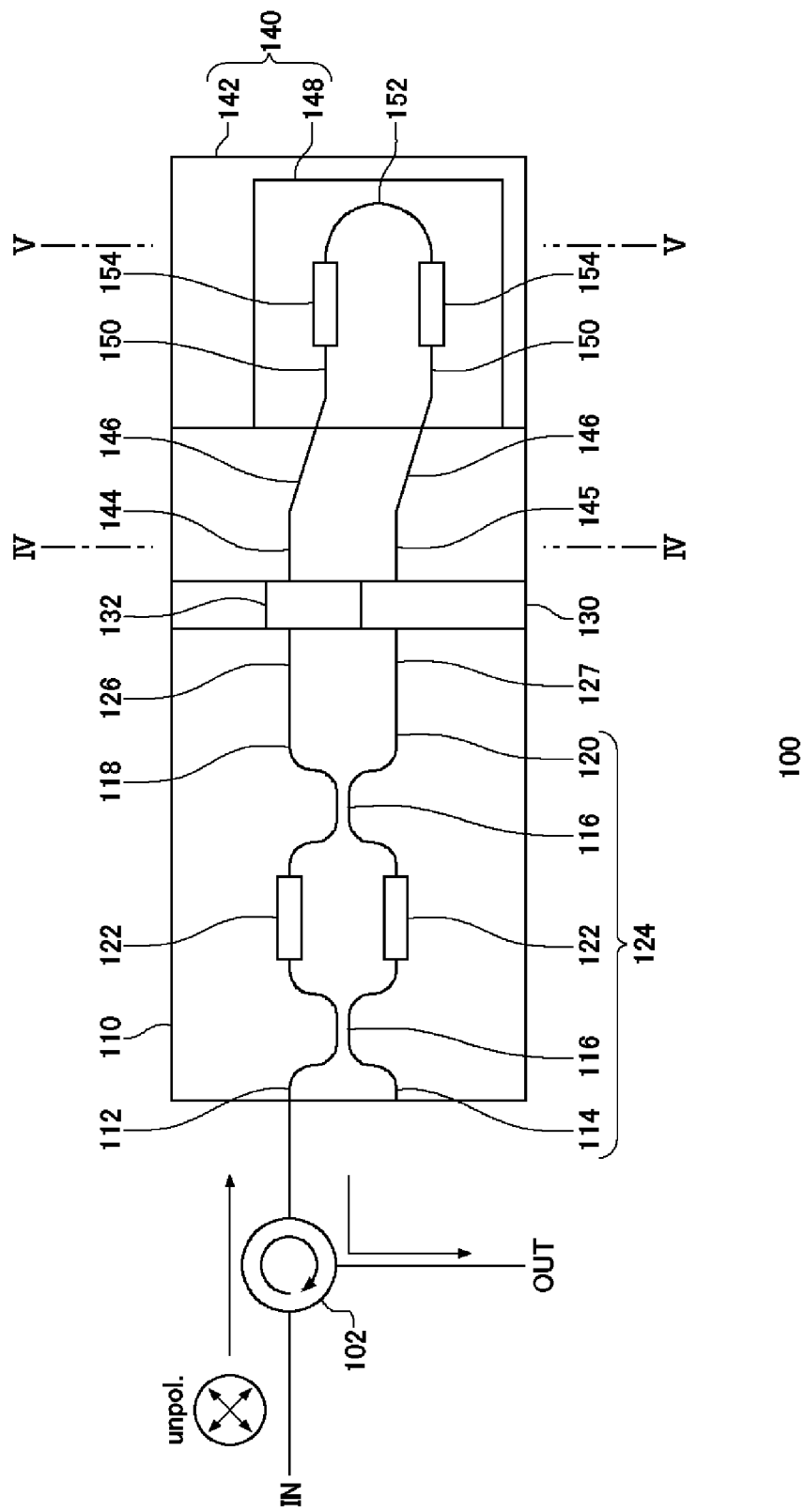
FIG. 1 is an overhead schematic view of an optical amplifier device according to a first embodiment of the present invention.

FIG. 1 is an overhead schematic view of an optical amplifier device 100 according to a first embodiment of the present invention. The optical amplifier device 100 includes a circulator 102, an optical amplifier device 100, a PLC-PBS chip (Planar Lightwave Circuit-Polarity Beam Splitter chip) 110, and an SOA-COS 140 (Semiconductor Optical Amplifier-Chip On Submount). The waveguide of the PLC-PBS chip 110 and the waveguide of the SOA-COS 140 are coupled to each other. The optical amplifier device 100 is an SOA-PLC hybrid-type integrated polarity diversity circuit.

The circulator 102 inputs incident light and outputs emission light. The incident light input to the optical amplifier device 100 from the input IN is propagated in the input port 112 by the circulator 102. The incident light is non-polarized light. The emission light propagated to the circulator 102 from the output port 114 is output from the output OUT by the circulator 102.

The PLC-PBS chip 110 includes an MZI 124 (Mach-Zehnder Interferometer), a quartz waveguide 126, a quartz waveguide 127, a slit 130, a half-wave plate 132, a quartz waveguide 144, a quartz waveguide 145, and an inclined waveguide 146. The MZI 124 includes an input port 112, an output port 114, a coupler 116, a pair of heaters 122, a TM output port 118, and a TE output port 120.

A pair of the heaters 122 are arranged respectively on the two arms of the MZI 124, and are coupled to the input port 112 and the output port 114 via the coupler 116. Furthermore, the heaters 122 are coupled to the TM output port 118 and the TE output port 120 on the opposite side of the input port 112 and the output port 114, via a coupler 116.

The quartz waveguide 126 coupled to the TM output port 118 is coupled to the quartz waveguide 144 via the half-wave plate 132. The half-wave plate 132 is formed in the slit 130 and provided between the quartz waveguide 126 and the quartz waveguide 144. The TM polarized light is converted into TE polarized light by the half-wave plate 132. The quartz waveguide 144 is coupled to the inclined waveguide 146. The quartz waveguide 127 coupled to the TE output port 120 is coupled to the quartz waveguide 145 via the slit 130. The quartz waveguide 145 is coupled to the inclined waveguide 146. The quartz waveguide 144, the quartz waveguide 145, and the inclined waveguide 146 have an embedded mesa structure.

The MZI 124 has a phase difference of $\Delta\Phi$ between the two arms. Birefringence occurs in the MZI 124, and the TE polarized light and the TM polarized light each have a different $\Delta\Phi$. With $\Delta\Phi_{TE}$ representing the phase difference of the TE polarized light and $\Delta\Phi_{TM}$ representing the phase difference of the TM polarized light, the expression $|\Delta\Phi_{TE}-\Delta\Phi_{TM}|=(2\pi/\lambda)B\cdot L$ can be defined. Here, $\lambda$ is the wavelength, B is the birefringence index of the MZI 124, and L is the length of the arms of the MZI 124. When $|\Delta\Phi_{TE}-\Delta\Phi_{TM}|=(2n+1)\pi$, where n is an integer, the non-polarized incident light input to the MZI 124 from the circulator 102 has its polarized component split by the MZI 124. As a result, the MZI 124 splits light into the TE polarized light and the TM polarized light, which is orthogonal to the TE polarized light. The TE polarized light is output to the TE output port 120 and the TM polarized light is output to a separate TM output port 118. The TM polarized light output from the TM output port 118 is converted into TE polarized light by the half-wave plate 132.

The SOA-COS 140 includes a silicon bench 142 and an SOA chip 148. The SOA chip 148 is mounted on the silicon bench 142. The mounting on the silicon bench 142 may be solder mounting. The SOA chip 148 includes a semiconductor optical waveguide 150, two SOAs 154, and a U-turn waveguide 152. The inclined waveguide 146 is formed between the quartz waveguide 144 and the semiconductor optical waveguide 150, and is at an angle relative to the quartz waveguide 144.

A portion of the semiconductor optical waveguide 150 on the SOA 154 side is formed to be parallel with the quartz waveguide 144. A portion of the semiconductor optical waveguide 150 on the inclined waveguide 146 side is formed to be at an angle relative to another position of the semiconductor optical waveguide 150. One end of the semiconductor optical waveguide 150 is coupled to the SOAs 154. The ends of the two SOAs 154 that are opposite the ends connected to the semiconductor optical waveguides 150 are coupled to a U-turn waveguide 152 formed as an arc shape. In other words, the two SOAs 154 are coupled to each other via the semiconductor U-turn waveguide 152. The U-turn waveguide 152 has a high mesa configuration obtained by etching a semiconductor core on a waveguide side.

Since the U-turn waveguide 152 forms a U-turn portion with an arc shape, the end of the semiconductor optical waveguide 150 opposite the SOAs 154 is formed in the same area as the SOA chip 148. Therefore, the size of the SOA-COS 140 can be decreased. The U-turn waveguide 152 has a high mesa structure, and therefore the light confinement strength is high and light loss due to bending can be restricted, even if the curvature radius of the U-turn waveguide 152 is 125 µm, for example. As a result, the optical amplification characteristic and noise characteristic can both be improved.

The TE polarized light output from the quartz waveguide 126 and converted by the half-wave plate 132 is input to the half-wave plate 132 side end of the waveguide of the SOA-COS 140. In other words, the light that has been converted to TE polarized light by the half-wave plate 132 is input to the semiconductor optical waveguide 150 on the half-wave plate 132 side via the quartz waveguide 144 and the inclined waveguide 146. The TE polarized light input to the quartz waveguide 144 on the half-wave plate 132 side is amplified by the two SOAs 154, and output from the other end of the waveguide of the SOA-COS 140, which is opposite the input end.

The TE polarized light output from the quartz waveguide 127 on the side where the half-wave plate 132 is not provided is input to the end of the waveguide of the SOA-COS 140 on the side where the half-wave plate 132 is not provided. In other words, the light output from the quartz waveguide 127 is input to the quartz waveguide 145. The TE polarized light input to the quartz waveguide 145 is amplified by the two SOAs 154, and output from one end of the waveguide of the SOA-COS 140 that is opposite the input end. In the manner described above, the SOA-COS 140 has bi-directional input in which light can be input from either end of the waveguide and amplified light is output from whichever end this light was not input to.

In the SOA-COS 140, the absolute value of the change in gain per unit intensity of the light input thereto, within an intensity range of the light input to the SOA-COS 140, is no greater than 0.16 dB/dBm. Here, the intensity range of the light input to the SOA-COS 140 may be greater than or equal to −30 dBm and less than or equal to 0 dBm. Furthermore, when the intensity of the input light increases by 1 dBm, the change in the gain per unit intensity of the input light is expressed by the increase value (dB) of the gain. In other words, with the intensity (dBm) of the input light on a horizontal axis and the gain (dB) on a vertical axis, the change in the gain per unit intensity of the input light corresponds to the slope in the graph. Furthermore, the change in the gain per unit intensity of the input light corresponds to a derivative value of an expression represented by a function of the gain (dB) and the intensity (dBm) of the input light. The PDG of the optical amplifier device 100 can be approximated by the expression PDG(dB)=ΔG(dB/dBm)×3(dBm). Here, ΔG is the absolute value of the change in gain per unit intensity (dB/dBm).

In the polarization diversity circuit, the gain is at a maximum when the intensity of the light in the TM output port 118 is equal to the intensity of the light in the TE output port 120. At this time, the output light can be expressed by $P_{out}$(dBm)= {$P_{in}$(dBm)−3}+{ΔG×3+G(dB)}+3(dB). Here, $P_{out}$ and $P_{in}$ are the total intensities obtained by combining the TE mode light intensity and the TM mode light intensity, for the output light and input light respectively. Furthermore, G is the gain for the input $P_{in}$. The term {$P_{in}$(dBm)−3}, which is the first term on the right side in the above expression, represents the intensity of the light input to each of the TE and TM ports. The input light is distributed uniformly between the TE and TM ports, which results in the term {$P_{in}$(dBm)−3}. The term {ΔG×3+G(dB)}, which is the second term on the right side of the above expression, represents the gain provided by the TE and TM ports. The term 3(dB), which is the third term on the right side of the above expression, corresponds to doubling through the combination of the TE port and TM port of the circulator 102 by the output port, and the a value of 3(dB) is added in the above expression. On the other hand, the gain is at a minimum when the incident light is output to only one of the TM output port 118 and the TE output port 120. At this time, the output can be expressed as $P_{out}$(dBm)=$P_{in}$(dBm)+G(dB). In the polarity diversity circuit, when the expression for the minimum gain is subtracted from the expression for the maximum gain, PDG is found to be ΔG×3(dB), and this is the same as the above expression of PDG(dB)=ΔG(dB/dBm)×3(dBm). In an SOA-COS 140 having significant nonlinearity for the gain, the difference between a case of maximum gain and a case of minimum gain is the PDG. Accordingly, the PDG for polarity diversity is approximated in the manner described above. In other words, if the absolute value of the change in gain per unit intensity within the intensity range of the light input to the SOA-COS 140 is 0.16 dB/dBm or less, then the PDG is 0.5 dB or less.

Figure 2:
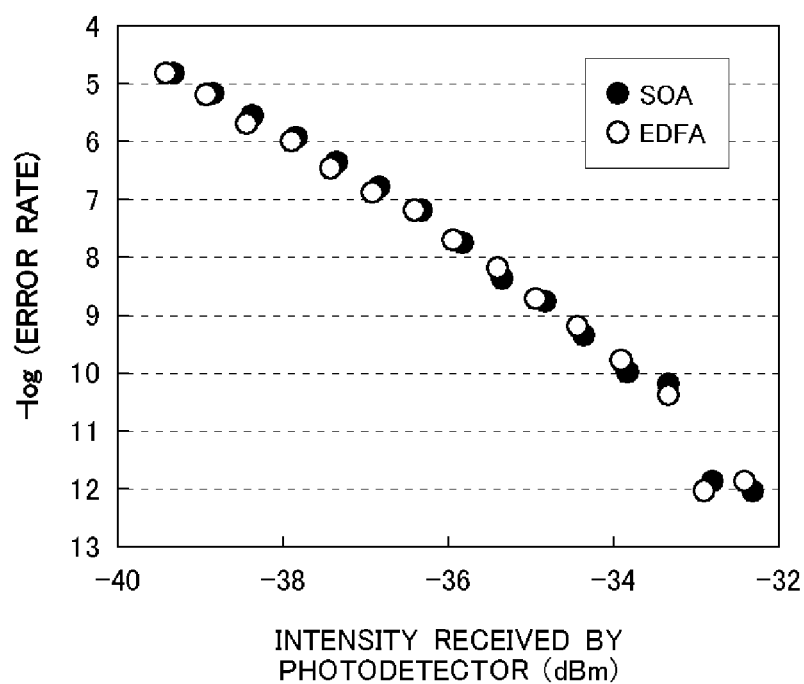
FIG. 2 shows the error rate characteristic for an SOA and EDFA used in a booster amplifier.

When the polarization direction of the light incident to the optical amplifier device 100 changes randomly, the PDG causes the gain to change, and therefore errors are caused by a change in the intensity of the light emitted from the optical amplifier device 100. If the PDG is 0.5 dB or lower, the effect is equivalent to that of other practical optical amplifiers, and this is a standard for what is allowable for use in optical transmission. FIG. 2 shows the error characteristic when an SOA (Semiconductor Optical Amplifier) having a PDG of 0.5 dB is used in an optical amplifier (booster amplifier) for amplifying an input signal. FIG. 2 shows the error rate for the SOA when put to the same use as an EDFA (Erbium Doped Fiber Amplifier) already used in a practical system. The intensity of the input to the SOA and EDFA is −2 dBm, and the output is set to 11 dBm. By inserting a variable attenuator downstream of the optical amplifier, the received intensity of the optical detected was changed and the error rate was measured. Based on FIG. 2, it was found that if the PDG of the SOA is 0.5 dB or less, then the same characteristics as the EDFA are realized. In other words, if the PDG is 0.5 dB or less, the back-to-back error rate characteristic occurring when light is not transmitted through the fiber has an error rate no greater than $10^{-9}$, and therefore data signals can be accurately transmitted. If this error rate is no greater than $10^{-9}$, after the conversion to an electrical signal, an error signal can be corrected by using an error correction code. The optical amplifier device 100 of the first embodiment, which is an SOA-PLC hybrid integrated polarization diversity circuit, includes an SOA-COS 140 in which the absolute value of the change in gain per unit intensity of the input light is 0.16 dB/dBm or less, and therefore the PDG is 0.5 dB or less and characteristics equivalent to those realized when using another practical optical amplifier can be obtained.

Here, the length of the optical path of the waveguide from one end of the waveguide of the SOA-COS 140 to one of the SOAs 154 is equal to the length of the optical path of the waveguide from the other end of the waveguide of the SOA-COS 140 to the other SOA 154. In other words, the length of the semiconductor optical waveguide 150 on the side where the half-wave plate 132 is provided is equal to the length of the semiconductor optical waveguide 150 on the side where the half-wave plate 132 is not provided. Here, the length of the waveguide refers to the length of the waveguide in the direction of the light path. As a result, there is a reduced difference between the intensity of the light input to the SOA 154 from the semiconductor optical waveguide 150 on the side where the half-wave plate 132 is provided and the intensity of the light input to the SOA 154 from the semiconductor optical waveguide 150 on the side where the half-wave plate 132 is not provided. The gains of the SOAs 154 may differ according to the intensity of the input light. In the optical amplifier device 100, since the difference in intensity of the lights input to the two SOAs 154 in each direction is small, the difference in the gain of the lights input tot eh SOAs 154 in each direction is also small. Accordingly, the gain fluctuation is restricted and the signal error can be decreased.

Furthermore, the total length of the quartz waveguide 144, the inclined waveguide 146, and the semiconductor optical waveguide 150 on the side where the half-wave plate 132 is provided may be equal to the total length of the quartz waveguide 145, the inclined waveguide 146, and the semiconductor optical waveguide 150 on the side where the half-wave plate 132 is not provided. As a result, the difference between the intensity of the TE polarized light input to the quartz waveguide 144 and the SOA 154 on the quartz waveguide 144 side and the intensity of the TE polarized light input to the quartz waveguide 145 and the SOA 154 on the quartz waveguide 145 side is further reduced. Accordingly, the difference in gain between the lights input to the SOAs 154 from each direction is further reduced, and the fluctuation in the gain can be restricted to reduce the signal error.

Figure 3:
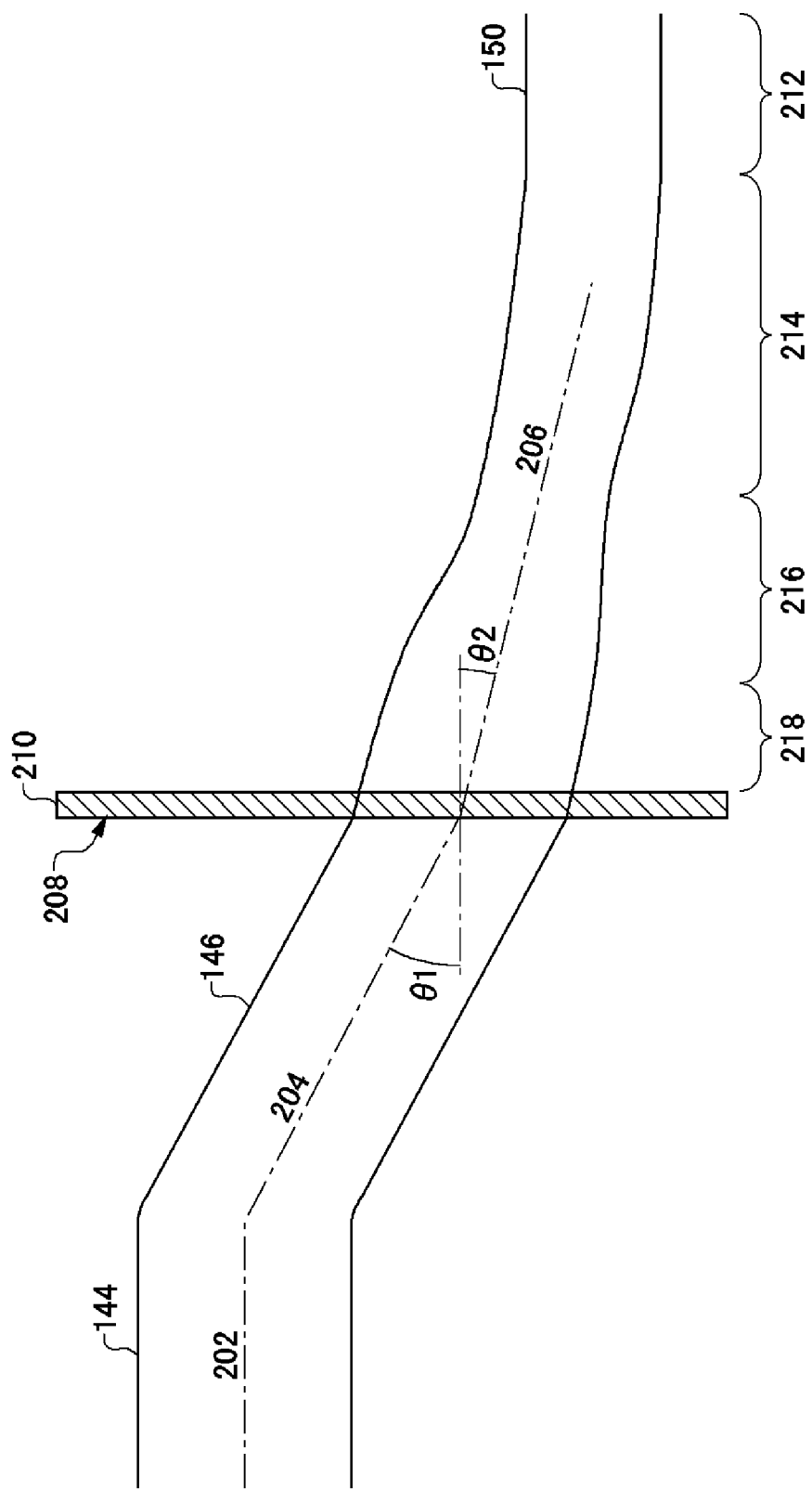
FIG. 3 is a schematic enlarged view of the inclined waveguide of the optical amplifier device according to the first embodiment.

FIG. 3 is a schematic enlarged view of the inclined waveguide 146 of the optical amplifier device 100 according to the first embodiment. FIG. 3 shows a portion of the inclined waveguide 146 side of the quartz waveguide 144 and a portion of the inclined waveguide 146 side of the semiconductor optical waveguide 150.

The central axis 204 of the inclined waveguide 146 forms a prescribed angle θ1 with respect to a straight line perpendicular to the bonding surface 208 between the SOA chip 148 and the PLC-PBS chip 110. The central axis 202 of the quartz waveguide 144 is formed parallel to the straight line perpendicular to the bonding surface 208, and the central axis 204 of the inclined waveguide 146 forms a prescribed angle θ1 relative to the central axis 202 of the quartz waveguide 144. As a result, the light input to the quartz waveguide 144 is incident to the bonding surface 208 at an angle.

The semiconductor optical waveguide 150 includes a wide portion 218, an SSC 216 (Spot Size Converter), a bending portion 214, and a narrow portion 212. The central axis 206 of the SSC 216 and the wide portion 218 of the semiconductor optical waveguide 150 forms a prescribed angle θ2 with respect to the straight line perpendicular to the bonding surface 208.

With $n_1$ representing the refractive index of the inclined waveguide 146 and $n_2$ representing the refractive index of the semiconductor optical waveguide 150, Snell's law can be used to determine θ1 and θ2 to fulfill the relationship $n_1 \sin\theta 1 = n_2 \sin\theta 2$. The bonding surface 208 is coated with an antireflection coat 210. Here, θ1 is preferably from 5° to 9°, and θ2 is preferably from 12° to 17°.

The semiconductor optical waveguide 150 can be bent at the bending portion 214 while maintaining the width of the narrow portion 212. The portion of the semiconductor optical waveguide 150 not shown has the same width as the narrow portion 212 of the semiconductor optical waveguide 150. The width of the waveguide refers to the width that is perpendicular to the optical path direction and within a plane parallel to the surface of the substrate on which the waveguide is formed.

The SSC 216 is an optical waveguide (width-flared SSC) with a tapered shape. Therefore, the mode field of the quartz waveguide 144 matches the mode field of the semiconductor optical waveguide 150. The semiconductor optical waveguide 150 has a width that expands at the SSC 216 and is the same as the width of the inclined waveguide 146 at the wide portion 218.

In the optical amplifier device 100 according to the first embodiment, the SSC 216 is formed in the SOA chip 148, but the SSC 216 may be formed in the PLC-PBS chip 110 instead. Due to the SSC 216, the coupling loss in the portion coupling with the waveguide can be decreased, thereby obtaining higher coupling efficiency.

The above describes the inclined waveguide 146 and the semiconductor optical waveguide 150 coupled to the quartz waveguide 144, but the inclined waveguide 146 and the semiconductor optical waveguide 150 coupled to the quartz waveguide 145 are the same.

Figure 4:
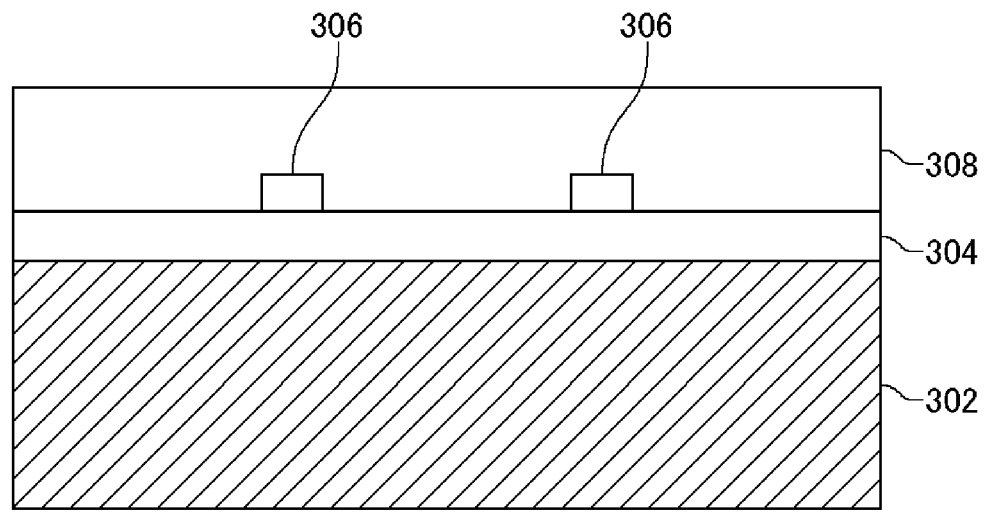
FIG. 4 is a schematic cross-sectional view of the quartz waveguide and the quartz waveguide of the optical amplifier device according to the first embodiment.

FIG. 4 is a schematic cross-sectional view of the quartz waveguide 144 and the quartz waveguide 145 of the optical amplifier device 100 according to the first embodiment. Specifically, FIG. 4 is a schematic cross-sectional view over the line IV-IV of FIG. 1. A lower cladding layer 304 is formed on the PLC platform 302. A core layer 306 is formed on a portion of the lower cladding layer 304. The core layer 306 is formed of a quartz material, and serves as the quartz waveguide 144 and the quartz waveguide 145.

An upper cladding layer 308 is formed on the core layer 306 and on the portion of the lower cladding layer 304 where the core layer 306 is not formed. In other words, the quartz waveguide 145 and the inclined waveguide 146 have an embedded mesa structure. The lower cladding layer 304 and the upper cladding layer 308 are formed of quartz material with a lower refractive index than the core layer 306. The lower cladding layer 304 and the upper cladding layer 308 may be formed of the same material. The inclined waveguide 146 may include the same cross-sectional structure as the quartz waveguide 144 and the quartz waveguide 145.

Figure 5:
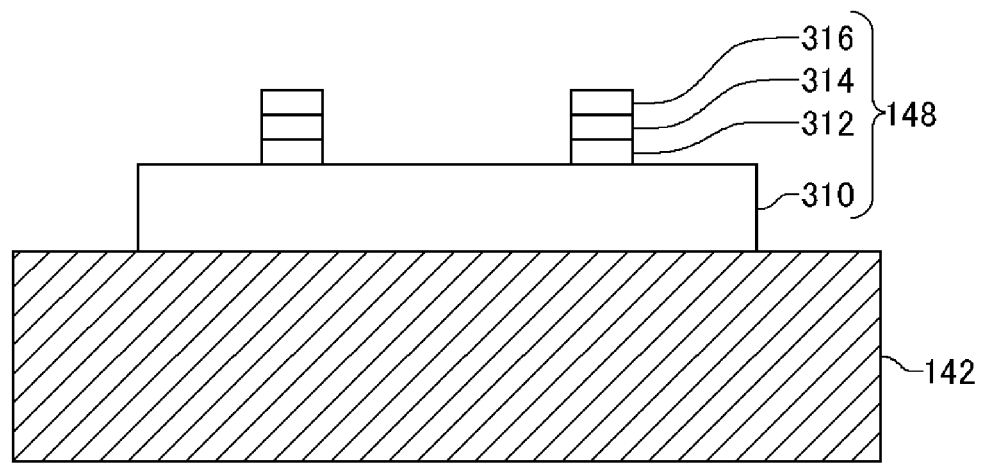
FIG. 5 is a schematic cross-sectional view of the U-turn waveguide of the optical amplifier device according to the first embodiment.

FIG. 5 is a schematic cross-sectional view of the U-turn waveguide 152 of the optical amplifier device 100 according to the first embodiment. Specifically, FIG. 5 is a schematic cross-sectional view over the line V-V of FIG. 1. A semiconductor substrate 310 is formed on the silicon bench 142. The semiconductor substrate 310 is formed of a compound semiconductor. A lower cladding layer 312 is formed on a portion of the semiconductor substrate 310. A core layer 314 is formed on the lower cladding layer 312. An upper cladding layer 316 is formed on the core layer 314. The core layer 314 is formed of a compound semiconductor. The lower cladding layer 312 and the upper cladding layer 316 are formed of a compound semiconductor material with a lower refractive index than the core layer 314. In other words, the U-turn waveguide 152 has a high mesa structure. The semiconductor substrate 310 may be formed of InP, the core layer 314 may be formed of GaAsP, and the lower cladding layer 312 and upper cladding layer 316 may be formed of InP, for example.

The curvature radius of the loop-back section provided in the optical waveguide can be made smaller when the difference between the specific refractive indexes of the core and the cladding is greater. Since the U-turn waveguide 152 has a high mesa structure, the difference between the specific refractive indexes of the core layer 314 and the air on both sides thereof becomes a high value of 30% to 40% or more, for example. Therefore, the curvature radius when viewed from above the U-turn waveguide 152 can be lowered to 125 μm, for example. In other words, compared to a case in which a loop-back structure including a U-turn optical waveguide is formed on a quartz PLC chip, forming a loop-back structure with a U-turn waveguide 152 that has a high mesa structure in the SOA-COS 140 enables the size of the SOA-COS 140 to be reduced. Accordingly, the size of the optical amplifier device 100 can be reduced.

Figure 6:
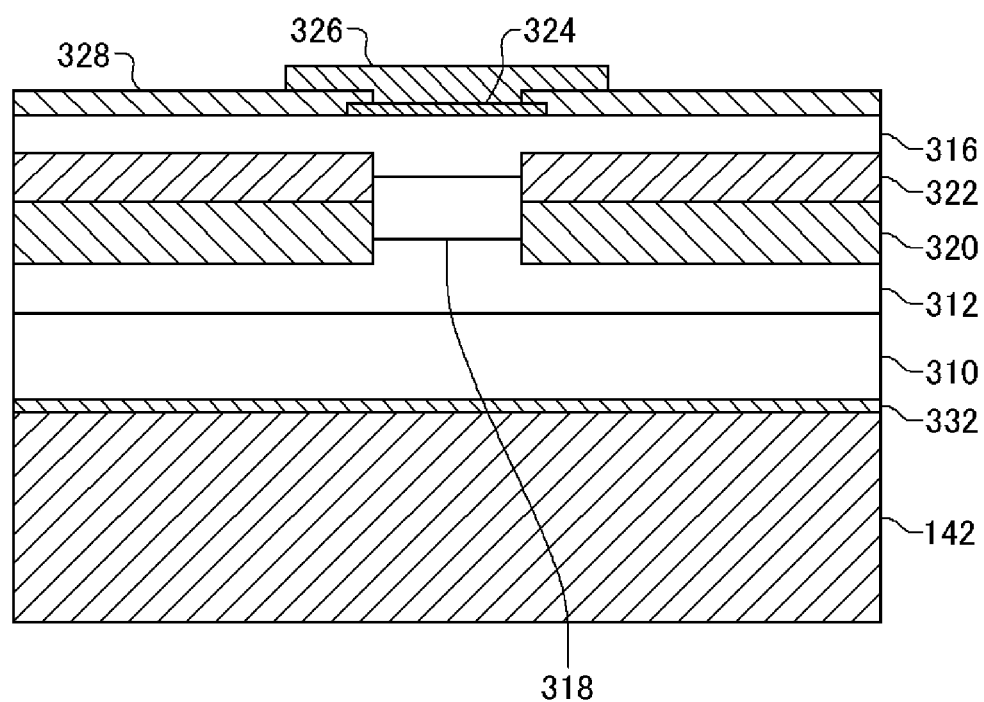
FIG. 6 is a schematic cross-sectional view of an SOA according to the first embodiment that is included in the optical amplifier device according to the first embodiment.

FIG. 6 is a schematic cross-sectional view of an SOA 154 according to the first embodiment that is included in the optical amplifier device 100 according to the first embodiment, from a direction perpendicular to the waveguide direction. The SOA 154 is formed on the semiconductor substrate 310 mounted on the silicon bench 142. The SOA 154 includes the semiconductor substrate 310, a lower cladding layer 312, an active layer 318, a buried layer 320, a current stopping layer 322, an upper cladding layer 316, a contact layer 324, a passivation layer 328, a p-side electrode 326, and an n-side electrode 332.

An n-side electrode 332 is formed on the rear surface of the semiconductor substrate 310, and the n-side electrode 332 contacts the top of the silicon bench 142. The semiconductor substrate 310 is formed of a compound semiconductor. The lower cladding layer 312 is formed on the semiconductor substrate 310. The active layer 318 is formed on a portion of the lower cladding layer 312. The active layer 318 has a multiquantum well structure formed by alternately layering a well layer and a barrier layer. For example, the active layer 318 may have a multiquantum well structure including five well layers, with each well layer having a thickness of 3.9 nm and each barrier layer having a thickness of 10 nm. The active layer 318 may be formed of GaInAsP, for example.

A portion of the lower cladding layer 312 in which the active layer 318 is not formed is removed, in the thickness direction of the lower cladding layer 312. In other words, the lower cladding layer 312 is thicker in the region under the active layer 318 than in the region where the active layer 318 is not formed. In the region where the active layer 318 is not formed, a buried layer 320 is formed on the lower cladding layer 312. The current stopping layer 322 is formed on the buried layer 320. The buried layer 320 is formed of p-InP, for example. The current stopping layer 322 is formed of n-InP, for example. The upper cladding layer 316 is formed on the active layer 318 and the current stopping layer 322. The top surface of the current stopping layer 322 protrudes beyond the top surface of the active layer 318. In other words, the upper cladding layer 316 on the active layer 318 is thicker than the active layer 318 on the current stopping layer 322.

The contact layer 324 is formed on the upper cladding layer 316, above the active layer 318. The passivation layer 328 is formed on the contact layer 324 and the upper cladding layer 316. A portion of the passivation layer 328 on the contact layer 324 is removed, and the p-side electrode 326 is formed thereon. The p-side electrode 326 is formed from an opening in the passivation layer 328 onto the passivation layer 328. In other words, the width of the p-side electrode 326 may be greater than the width of the active layer 318. Here, the "width" refers to the length in a direction of the light path in the active layer 318 and a direction perpendicular to the direction of the thickness of the active layer 318. An inverse distribution is formed by the carriers of the electrons and the holes introduced from the p-side electrode 326 and the n-side electrode 332, and the light is amplified in the active layer 318.

Figure 7A:
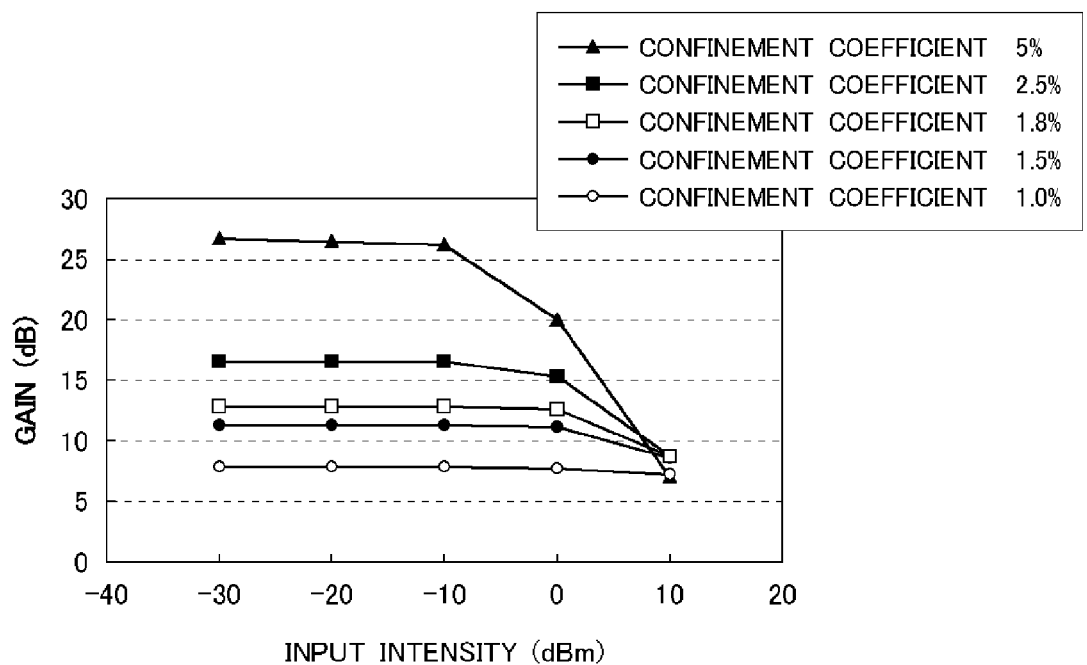
FIG. 7A shows the relationship between the gain and the intensity of the light input to the SOA according to the first embodiment, when the confinement coefficient is changed.
Figure 7B:
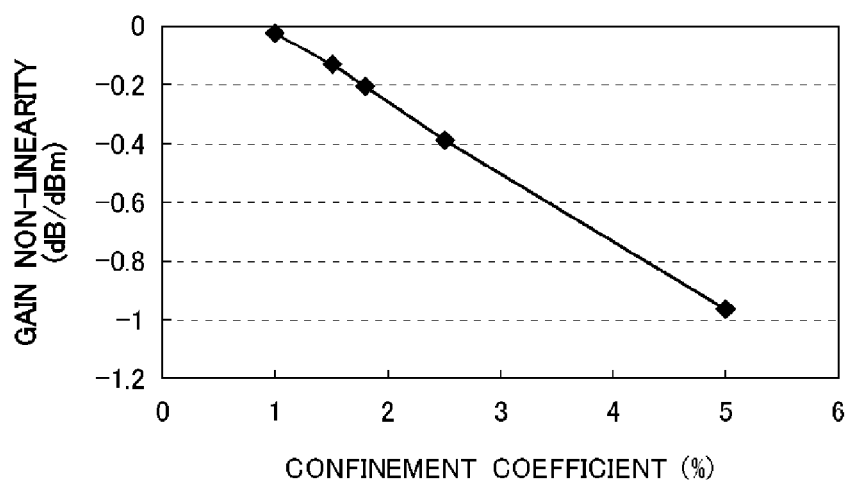
FIG. 7B shows the relationship between the non-linearity of the gain and the confinement coefficient in the SOA according to the first embodiment, when the intensity of the input light is 0 dB.

FIGS. 7A and 7B show a relationship between the non-linearity of the gain and the confinement coefficient $\Gamma$ of the SOA 154 according to the first embodiment. The confinement coefficient $\Gamma$ is the ratio of the light confined in the active layer 318 to the light in the SOA 154. The results shown in FIGS. 7A and 7B were obtained when the mesa width of the SOA 154 was 2 μm, the length of the SOA was 1000 μm, and the current injected from the p-side electrode 326 and the n-side electrode 332 was 200 mA. The mesa width refers to the width of the active layer 318 in a direction of the optical path length and a direction perpendicular to the direction of the injected current. The length of the SOA refers to the length of the region in which both the active layer 318, the p-side electrode 326, and the n-side electrode 332 are formed in the SOA 154, in a direction parallel to the length of the optical path. In other words, in the SOA 154, the light is amplified within a range of the length of the SOA.

The graph of FIG. 7A shows the relationship between the gain and the intensity of the light input to the SOA 154, when the confinement coefficient $\Gamma$ is changed from 1% to 5%. The horizontal axis indicates the intensity (dBm) of the light input to the SOA 154, and the vertical axis represents the gain (dB). In the region where the intensity of the input light is less than 0 dB, the gain has little dependence on the intensity of the input light, and when the intensity of the input light is −10 dB or less, the gain does not depend on the intensity of the input light. As the intensity of the input light increases, the dependency of the gain on the intensity of the input light increases. Furthermore, when the intensity of the input light is larger, the gain is smaller.

The graph of FIG. 7B shows the relationship between the non-linearity of the gain and the confinement coefficient $\Gamma$, when the intensity of the input light is 0 dB. A value of 0 dB is the maximum power input to a boost amp and pre-amp in long-distance optical communication. The horizontal axis indicates the confinement coefficient $\Gamma$, and the vertical axis indicates the non-linearity (dB/dBm) of the gain. The non-linearity of the gain is the amount of change in the gain per unit intensity of the input light. In other words, the non-linearity of the gain is the value of the slope of the graphed line when the intensity of the light is plotted on the horizontal axis and the gain is plotted on the vertical axis. When the confinement coefficient is smaller, the absolute value of the non-linearity of the gain is smaller.

The non-linearity of the gain tends to decrease linearly relative to the confinement coefficient $\Gamma$. With a confinement coefficient of 1.5% or less, the non-linearity of the gain of the SOA 154 is 0.13 dB/dBm or less. With a confinement coefficient of 1.6% or less, the non-linearity of the gain of the SOA 154 is 0.15 dB/dBm or less. Accordingly, since the PDG of the optical amplifier device 100 is 0.5 dB or less, these values are acceptable for optical communication.

Figure 8A:
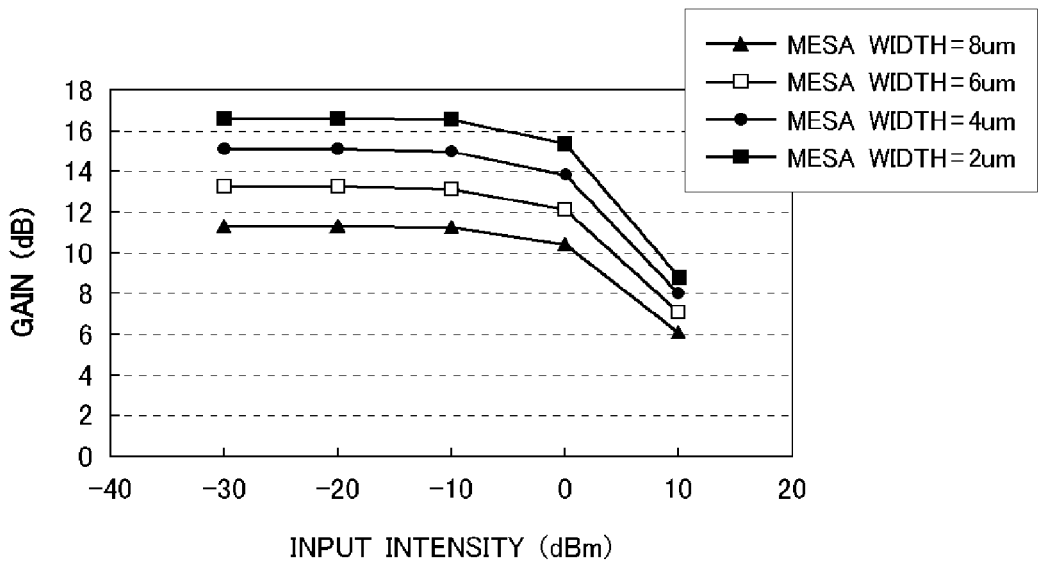
FIG. 8A shows the relationship between the gain and the intensity of the light input to the SOA according to the first embodiment, when the mesa width is changed.
Figure 8B:
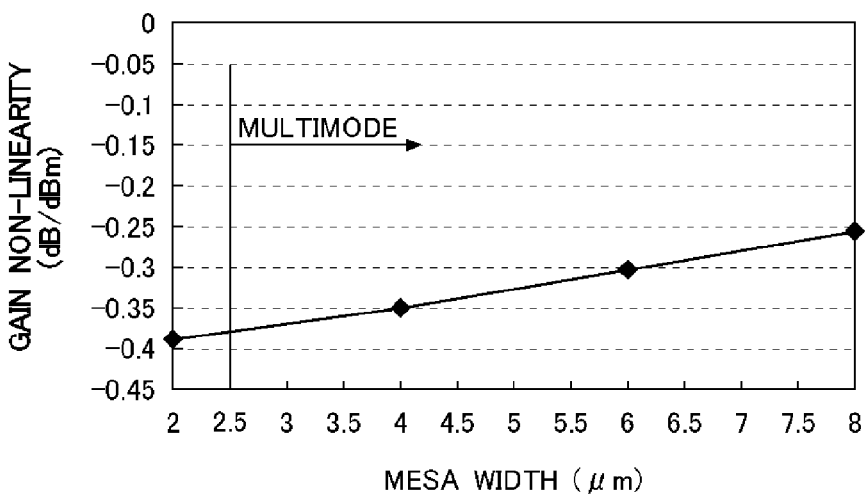
FIG. 8B shows the relationship between the non-linearity of the gain and the mesa width in the SOA according to the first embodiment, when the intensity of the input light is 0 dB.

FIGS. 8A and 8B show the relationship between the non-linearity of the gain and the mesa width in the SOA 154 of the first embodiment. The results shown in FIGS. 8A and 8B were obtained when the length of the SOA 154 was 1000 μm, the confinement coefficient $\Gamma$ was 2.5%, and the current injected from the p-side electrode 326 and the n-side electrode 332 was 200 mA.

The graph of FIG. 8A shows the relationship between the gain and the intensity of the light input to the SOA 154 when the mesa width is changed from 2 μm to 8 μm. The horizontal axis indicates the intensity (dBm) of the light input to the SOA 154, and the vertical axis indicates the gain (dB). The results indicated the same trend as in the graph of FIG. 7A. The graph of FIG. 8B shows the relationship between the non-linearity of the gain and the mesa width, when the intensity of the input light is 0 dB. The horizontal axis indicates the mesa width, and the vertical axis represents the non-linearity (dB/dBm) of the gain. When the mesa width is greater, the non-linearity of the gain is lower. It should be noted that a mesa width greater than 2.5 μm results in multimode operation. Accordingly, for an amplifier used in long-distance optical communication, the SOA 154 preferably has a mesa width of 2.5 μm or less.

Figure 9A:
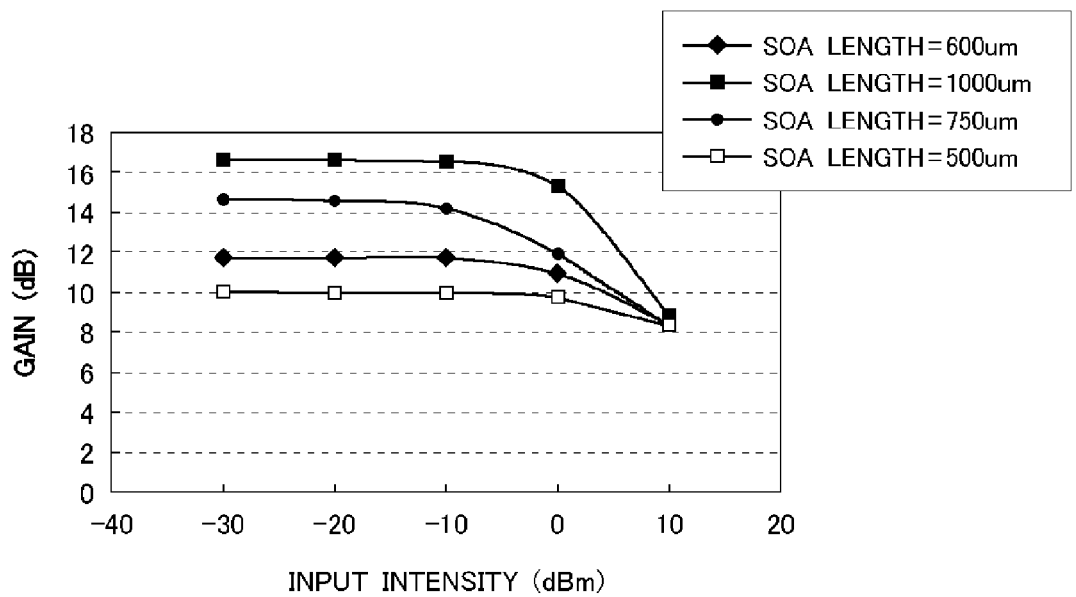
FIG. 9A shows the relationship between the gain and the intensity of the light input to the SOA according to the first embodiment, when the SOA length is changed.
Figure 9B:
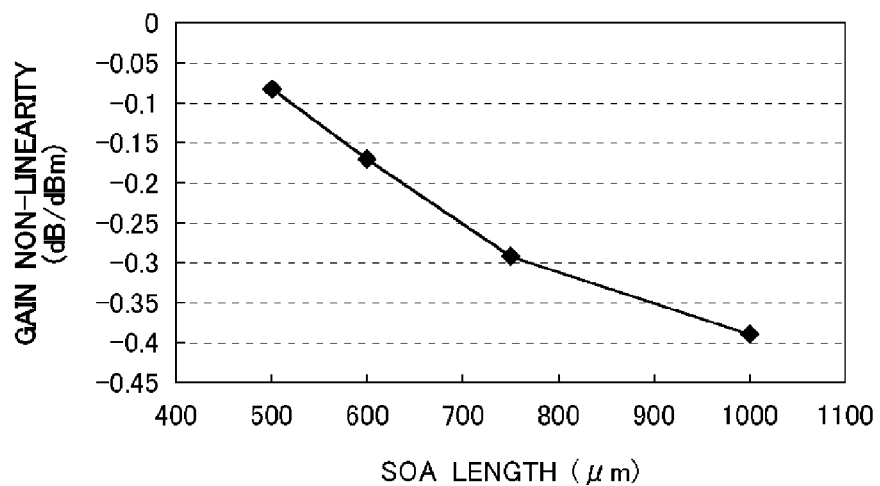
FIG. 9B shows the relationship between the non-linearity of the gain and the SOA length in the SOA according to the first embodiment, when the intensity of the input light is 0 dB.

FIGS. 9A and 9B show the relationship between the non-linearity of the gain and the length of the SOA 154 according to the first embodiment. In other words, FIGS. 9A and 9B show the non-linearity of the gain and the gain when the intensity of the light input to the SOA 154 is changed, while changing the length of the SOA 154. The results shown in FIGS. 9A and 9B were obtained when the confinement coefficient $\Gamma$ of the SOA 154 was 2.5%, the mesa width was 2 μm, and the current injected from the p-side electrode 326 and the n-side electrode 332 was 200 mA.

The graph of FIG. 9A shows the relationship between the gain and the intensity of the light input to the SOA 154, when the SOA length is changed from 500 μm to 1000 μm. The horizontal axis indicates the intensity (dBm) of the light input to the SOA 154, and the vertical axis indicates the gain (dB). The results indicated the same trend as in the graph of FIGS. 7A and 8A. The graph of FIG. 9B shows the relationship between the non-linearity of the gain and the SOA length, when the intensity of the input light is 0 dB. The horizontal axis indicates the SOA length, and the vertical axis represents the non-linearity (dB/dBm) of the gain. When the SOA length is greater, the non-linearity of the gain is also greater.

The non-linearity gain characteristic tends to decrease with respect to the SOA length. With an SOA length of 550 μm or less, the non-linearity of the gain of the SOA 154 is 0.13 dB/dBm or less. With an SOA length of 600 μm or less, the non-linearity of the gain of the SOA 154 is 0.16 dB/dBm or less. Accordingly, since the PDG of the optical amplifier device 100 is to be 0.5 dB or less, these values are acceptable for optical communication.

Based on the above results, with F representing the light confinement coefficient of the SOA 154 and L indicating the SOA length, it is preferable that Γ×L be less than 1500% μm. As a result, the non-linearity of the gain of the SOA 154 is 0.16 dB/dBm or less and the PDG of the optical amplifier device 100 is 0.5 dB or less, and therefore these values are acceptable for optical communication.

Figure 10:
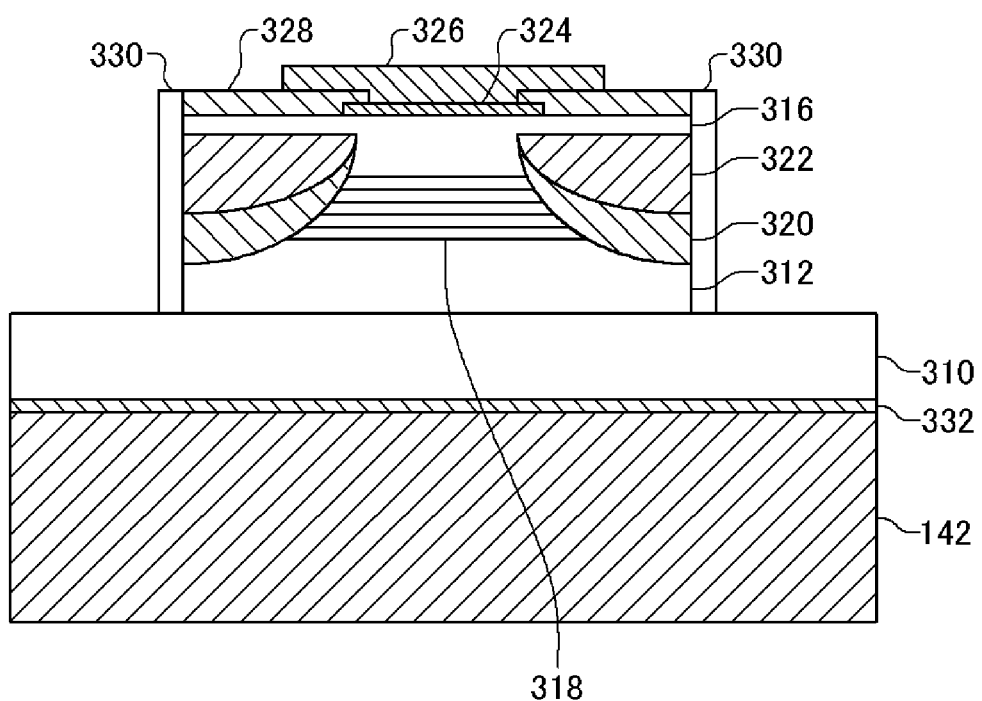
FIG. 10 is a schematic cross-sectional view of an SOA according to a second embodiment of the present invention.

FIG. 10 is a schematic cross-sectional view of an SOA 154 according to a second embodiment of the present invention. The SOA 154 of the optical amplifier device 100 is not limited to the SOA 154 of the first embodiment shown in FIG. 6, and the SOA 154 according to the second embodiment shown in FIG. 10 may be used instead. In FIG. 10, components having the same reference numerals as components in FIG. 6 may have the same function and configuration as the components described in FIG. 6. The SOA 154 according to the second embodiment includes a reflective film 330 and uses a different shape for the lower cladding layer 312, the active layer 318, the upper cladding layer 316, the buried layer 320, and the current stopping layer 322, but is otherwise the same as the SOA 154 according to the first embodiment.

The SOA 154 is formed on the semiconductor substrate 310 mounted on the silicon bench 142. The SOA 154 includes the semiconductor substrate 310, the lower cladding layer 312, the active layer 318, the buried layer 320, the current stopping layer 322, the upper cladding layer 316, the contact layer 324, the passivation layer 328, the reflective film 330, the p-side electrode 326, and the n-side electrode 332.

An upper portion of the lower cladding layer 312, the active layer 318, and a lower portion of the upper cladding layer 316 are formed with a tapered shape. Furthermore, the top surface of the lower cladding layer 312 in a region where the active layer 318 is not formed, the side surfaces of the active layer 318, and the side surfaces of the upper cladding layer 316 formed in the region sandwiched between the current stopping layer 322 on the active layer 318 are curved in a manner to protrude downward.

The buried layer 320 is formed to contact the top surface of the lower cladding layer 312 in a region where the active layer 318 is not formed, the side surfaces of the active layer 318, and the side surfaces of the upper cladding layer 316 formed in the region sandwiched between the current stopping layer 322 on the active layer 318 are curved in a manner to protrude downward. The thickness of the current stopping layer 322 is smaller at a location closer to the center of the optical path in the SOA 154. The current stopping layer 322 is on the buried layer 320, and therefore the interface between the buried layer 320 and the current stopping layer 322 is a curved surface facing downward. The top surface of the current stopping layer 322 is parallel to the top surface of the semiconductor substrate 310.

The reflective film 330 which reflects the light is formed on both ends of the lower cladding layer 312, the buried layer 320, the current stopping layer 322, the upper cladding layer 316, and the passivation layer 328. The carriers are injected from the p-side electrode 326 and the n-side electrode 332, and the light released from the active layer 318 is reflected by the reflective film 330. As a result, the light resonates in a direction perpendicular to the direction of the optical path of the SOA 154, which is a direction parallel to the surface of the semiconductor substrate 310. Accordingly, the gain of the SOA 154 becomes constant. In other words, the SOA 154 performs gain clamping. The gain of the SOA 154 is constant and does not depend on the intensity of the light input to the SOA 154, and therefore the non-linearity of the gain is reduced. As a result, the PDG of the optical amplifier device 100 is also reduced.

Figure 11:
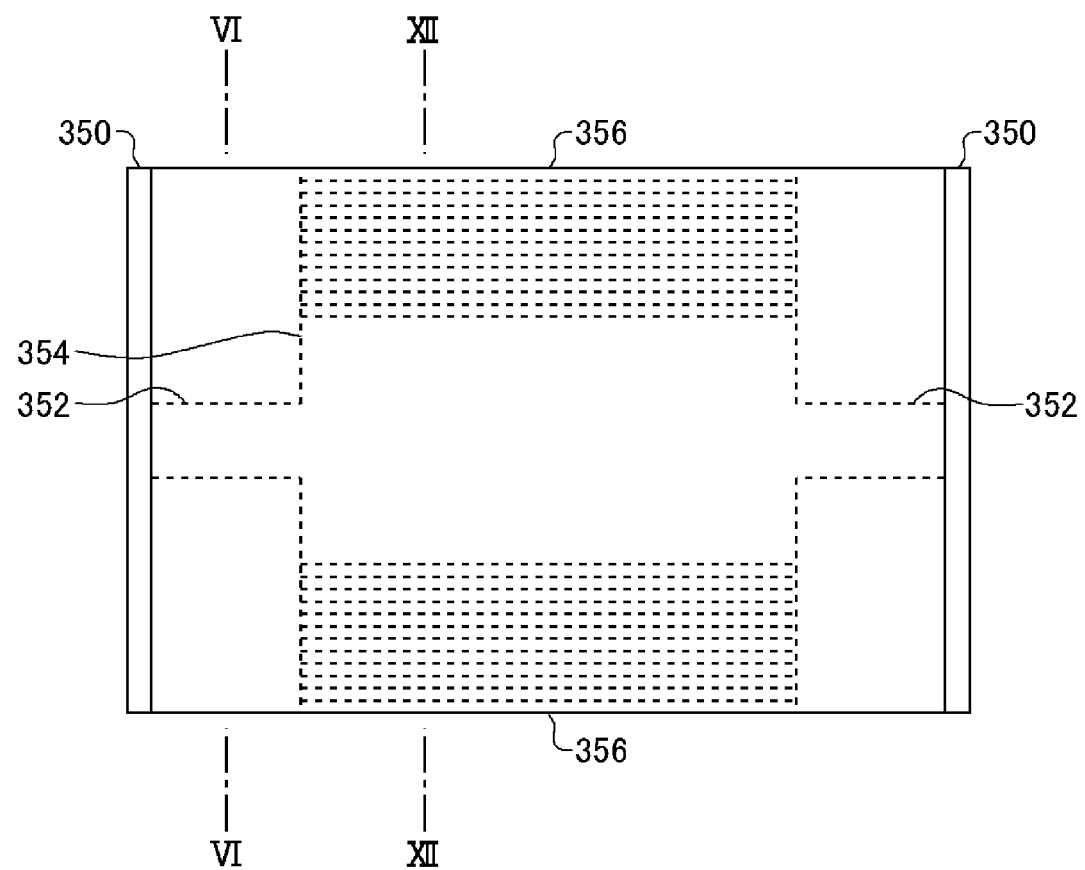
FIG. 11 is a schematic overhead view of the SOA according to a third embodiment of the present invention.

FIG. 11 is a schematic overhead view of the SOA 154 according to a third embodiment of the present invention. The SOA 154 includes an optical waveguide 352, a gain clamping waveguide 354, a diffraction grating 356, and an antireflection film 350. The diffraction grating 356 is formed on both sides of the gain clamping waveguide 354. The phrase "both sides of the gain clamping waveguide 354" refers to the sides in a direction perpendicular to the optical path, which is a direction parallel to the surface of the silicon bench 142. The optical waveguide 352 is coupled to both ends of the gain clamping waveguide 354 in the optical path direction. The antireflection film 350 is formed on the end of the optical waveguide 352 that is opposite the gain clamping waveguide 354 side. In other words, the antireflection film 350 is formed on both ends in the direction of the optical path of the SOA 154. With the antireflection film 350, the reflection of light at both ends of the SOA 154 can be restricted. The cross-section of the SOA 154 over the line VI-VI has the same structure as shown in FIG. 6.

The light emitted by the gain clamping waveguide 354 is reflected by the diffraction grating 356. As a result, resonance occurs in a direction perpendicular to the direction of the light path of the SOA 154, which is a direction parallel to the surface of the silicon bench 142. Accordingly, the gain of the SOA 154 becomes constant. In other words, the SOA 154 performs gain clamping. The gain of the SOA 154 is constant and does not depend on the intensity of the light input to the SOA 154, and therefore the non-linearity of the gain is reduced. As a result, the PDG of the optical amplifier device 100 is also reduced.

Figure 12:
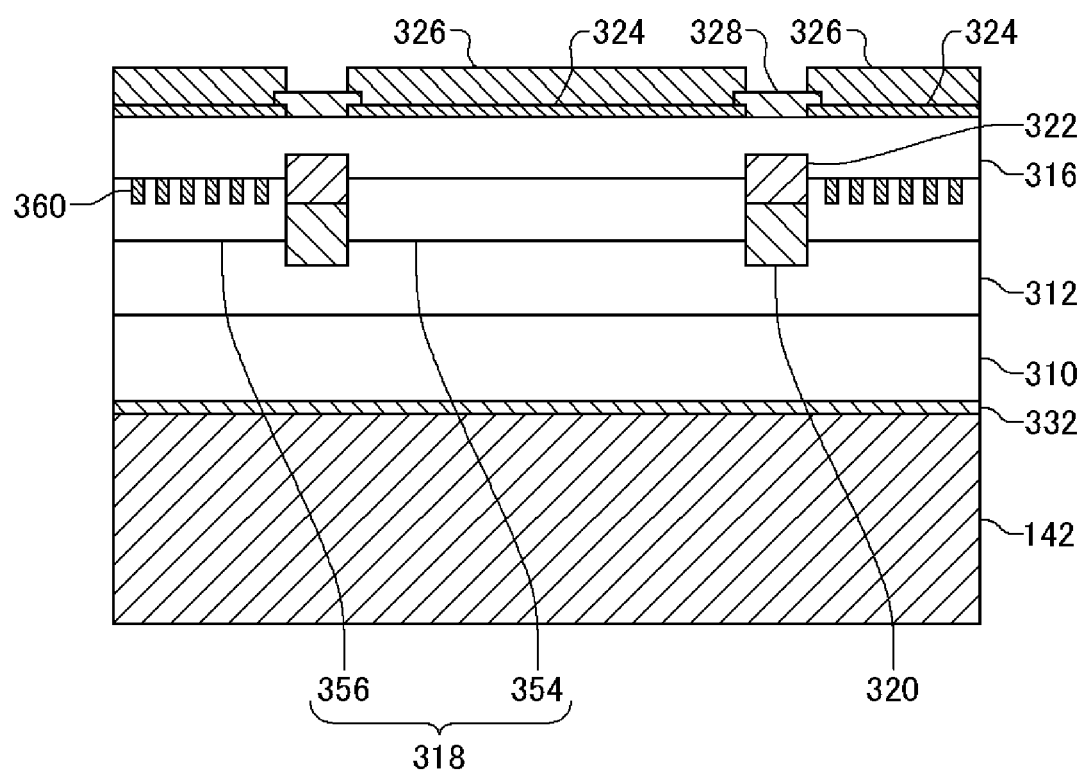
FIG. 12 is a schematic cross-sectional view of the gain clamping waveguide in the SOA according to the third embodiment.

FIG. 12 is a schematic cross-sectional view of the gain clamping waveguide 354 in the SOA 154 according to the third embodiment. Specifically, FIG. 12 is a schematic cross-sectional view over the line XII-XII of FIG. 11. In FIG. 12, components having the same reference numerals as components in FIG. 6 may have the same function and configuration as the components described in FIG. 6. The SOA 154 is formed on the semiconductor substrate 310 mounted on the silicon bench 142. The SOA 154 includes, in the cross section of the gain clamping waveguide 354, the semiconductor substrate 310, the lower cladding layer 312, the active layer 318, the upper cladding layer 316, the buried layer 320, the current stopping layer 322, the contact layer 324, the p-side electrode 326, the passivation layer 328, and the n-side electrode 332.

The lower cladding layer 312 is formed on the semiconductor substrate 310. The active layer 318 is formed on the lower cladding layer 312. Portions of the active layer 318 on respective sides sandwiching the central region serving as the optical path are removed. Portions of the lower cladding layer 312 in the thickness direction are removed in the region from which the active layer 318 was removed. In other words, the bottom portion of the lower cladding layer 312 in the region where the active layer 318 is removed is thinner than in other regions. The buried layer 320 is formed in the region from which the active layer 318 was removed. The current stopping layer 322 is formed on the buried layer 320.

The region sandwiched between the buried layer 320 and the current stopping layer 322 becomes the gain clamping waveguide 354. A plurality of InP buried layers 360 are formed of InP in the active layer 318, on opposite ends of the central region serving as the light path of the active layer 318 in a manner to sandwich the buried layer 320 and the current stopping layer 322. The InP buried layers 360 are formed with a prescribed depth in a depth direction from the top surface of the active layer 318. Furthermore, the InP buried layers 360 are formed at prescribed intervals in the direction of the optical path. The active layer 318 in which the InP buried layers 360 are formed acts as a diffraction grating 356, and reflects light in a direction perpendicular to the optical path. It should be noted that the diffraction grating 356 need only be configured to have a complex refractive index that is periodically perturbed, and is not limited to the active layer 318 having the InP buried layers 360 formed therein.

The top surface of the current stopping layer 322 protrudes beyond the top surface of the active layer 318. The upper cladding layer 316 is formed on the active layer 318 and the current stopping layer 322. The contact layer 324 is formed on the upper cladding layer 316. The contact layer 324 is removed from above the current stopping layer 322, and the passivation layer 328 is formed in this region. The p-side electrode 326 is formed on the contact layer 324. The carriers are injected from the p-side electrode 326 and the n-side electrode 332, and the light generated by the active layer 318 is reflected and resonated by the diffraction grating 356 including the InP buried layers 360, and therefore gain clamping occurs in the gain clamping waveguide 354.

Figure 13:
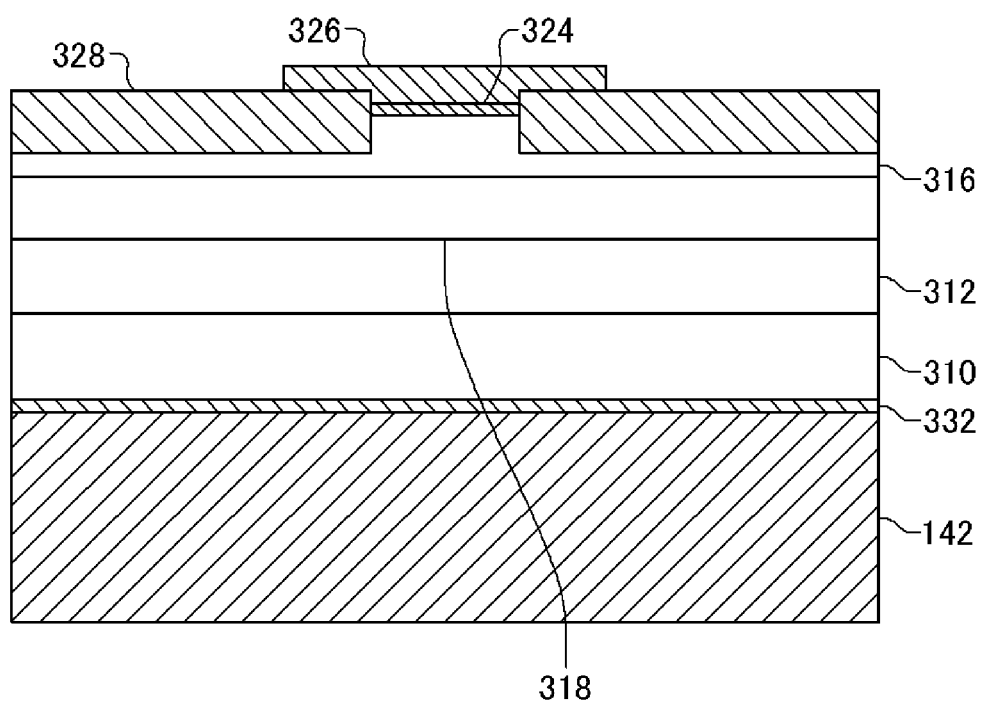
FIG. 13 is a schematic cross-sectional view of the optical waveguide in the SOA according to a fourth embodiment of the present invention.

FIG. 13 is a schematic cross-sectional view of the optical waveguide 352 in the SOA 154 according to a fourth embodiment of the present invention. The top view of the SOA 154 according to the fourth embodiment is the same as the top view of the SOA 154 according to the third embodiment shown in FIG. 11. FIG. 13 is a schematic cross-sectional configuration of the SOA 154 according to the fourth embodiment, over the line VI-VI of FIG. 11. In FIG. 13, components having the same reference numerals as components in FIG. 6 may have the same function and configuration as the components described in FIG. 6.

The SOA 154 is formed on the semiconductor substrate 310 mounted on the silicon bench 142. The SOA 154 includes, in the optical waveguide 352, the semiconductor substrate 310, the lower cladding layer 312, the active layer 318, the upper cladding layer 316, the contact layer 324, the p-side electrode 326, the passivation layer 328, and the n-side electrode 332. The cross section of the optical waveguide 352 of the SOA 154 according to the fourth embodiment differs from the cross section shown in FIG. 6 in that the buried layer 320 and the current stopping layer 322 are not included and that the upper cladding layer 316 and the passivation layer 328 are shaped differently.

Portions of the upper cladding layer 316 in the thickness direction are removed from both sides of a central portion that is along the optical path. The upper cladding layer 316 is thinner in the region where the portions have been removed in the thickness direction than in other regions. The passivation layer 328 is formed on the upper cladding layer 316, in the region from which the portions of the upper cladding layer 316 have been removed. The contact layer 324 is formed on the upper cladding layer 316 in the region that is thicker than other regions, which is the region sandwiching the passivation layer 328. The p-side electrode 326 is formed on the contact layer 324. The top surface of the passivation layer 328 protrudes above the top surface of the contact layer 324. The p-side electrode 326 is wider than the contact layer 324.

Figure 14:
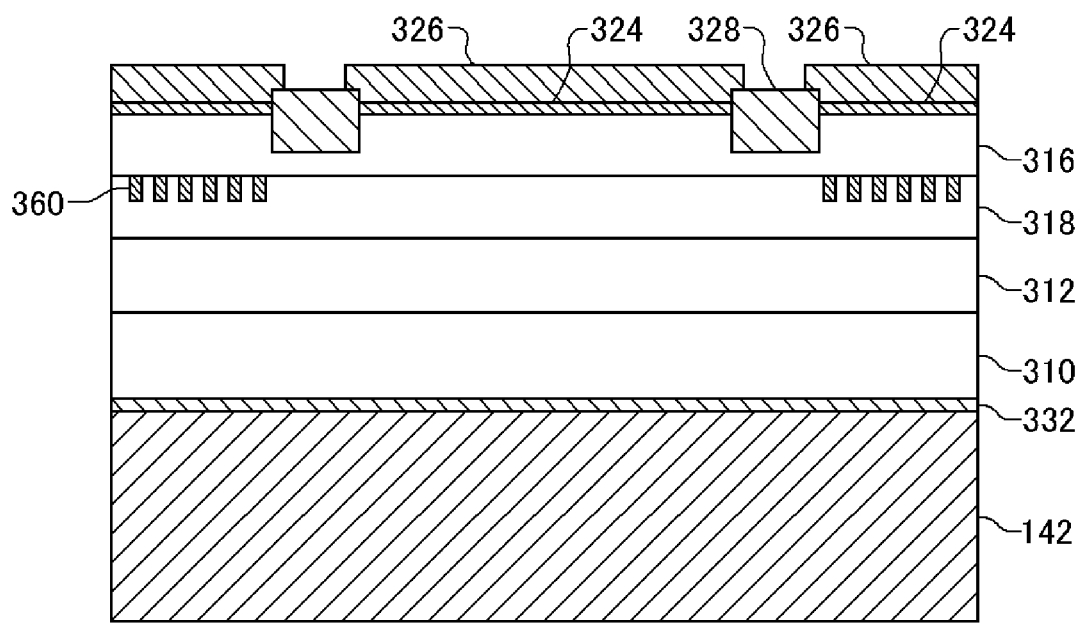
FIG. 14 is a schematic cross-sectional view of the gain clamping waveguide of the SOA according to the fourth embodiment.

FIG. 14 is a schematic cross-sectional view of the gain clamping waveguide 354 of the SOA 154 according to the fourth embodiment. Specifically, FIG. 14 is a schematic cross-sectional view of the SOA 154 according to the fourth embodiment, over the line XII-XII of FIG. 11. In FIG. 14, components having the same reference numerals as components in FIG. 12 may have the same function and configuration as the components described in FIG. 12. The SOA 154 is formed on the semiconductor substrate 310 mounted on the silicon bench 142. The SOA 154 includes, in the gain clamping waveguide 354, the semiconductor substrate 310, the lower cladding layer 312, the active layer 318, the InP buried layers 360, the upper cladding layer 316, the contact layer 324, the p-side electrode 326, the passivation layer 328, and the n-side electrode 332. The cross section of the gain clamping waveguide 354 of the SOA 154 according to the fourth embodiment differs from the cross section shown in FIG. 12 in that the buried layer 320 and the current stopping layer 322 are not included and that the upper cladding layer 316 and the passivation layer 328 are shaped differently.

The upper cladding layer 316 is thinner in portions on both sides of a central portion that is along the optical path than in other regions. The passivation layer 328 is formed on the upper cladding layer 316 in the portions that are thinner than the other regions of the upper cladding layer 316. The contact layer 324 is formed on the upper cladding layer 316 in the region of the upper cladding layer 316 that is thicker than the other region. The p-side electrode 326 is formed on the contact layer 324. The top surface of the passivation layer 328 protrudes above the top surface of the contact layer 324. The width of the p-side electrode 326 is greater than the width of the contact layer 324. The carriers injected from the p-side electrode 326 and the n-side electrode 332 are focused in a central portion of the active layer 318, by the passivation layer 328. The light generated from the active layer 318 in response to the injection of the carriers is reflected and resonated by the diffraction grating 356 including the InP buried layers 360, and therefore gain clamping occurs in the gain clamping waveguide 354. The gain of the SOA 154 is constant and does not depend on the intensity of the light input to the SOA 154, and therefore the non-linearity of the gain is reduced. As a result, the PDG of the optical amplifier device 100 is also reduced.

Figure 15:
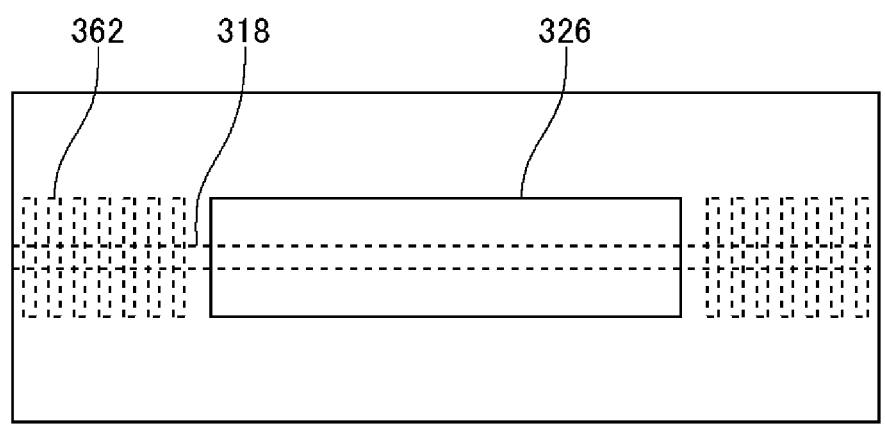
FIG. 15 is a schematic overhead view of an SOA according to a fifth embodiment of the present invention.

FIG. 15 is a schematic overhead view of an SOA 154 according to a fifth embodiment of the present invention. The SOA 154 includes the p-side electrode 326, the active layer 318, and a Bragg grating 362. In FIG. 15, components having the same reference numerals as components in FIGS. 6 and 11 may have the same function and configuration as the components described in FIGS. 6 and 11. The SOA 154 according to the fifth embodiment has the same configuration as the cross section shown in FIG. 6 in the region where the p-side electrode 326 is formed. The Bragg grating 362 is formed on both ends of the active layer 318 along the optical path. The Bragg grating 362 is formed at both ends of the SOA 154 along the optical path, and provides a periodic perturbation in the sub refractive index in the direction along the optical axis of the SOA 154. As a result, the carriers are injected by the p-side electrode 326 and the n-side electrode, which is not shown in FIG. 15, and the light generated by the active layer 318 is reflected and resonated by the Bragg grating 362, thereby causing gain clamping in the SOA 154. The gain of the SOA 154 is constant and does not depend on the intensity of the light input to the SOA 154, and therefore the non-linearity of the gain is reduced. As a result, the PDG of the optical amplifier device 100 is also reduced.

Figure 16:
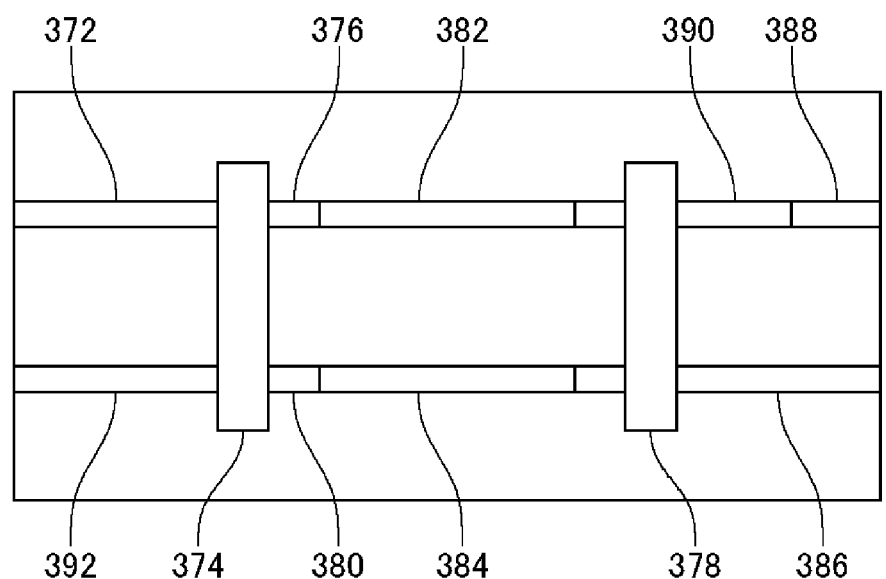
FIG. 16 is a schematic overhead view of an SOA according to a sixth embodiment of the present invention.

FIG. 16 is a schematic overhead view of an SOA 154 according to a sixth embodiment of the present invention. The SOA 154 includes a waveguide 372, a coupler 374, an arm 376, a coupler 378, an arm 380, an amplifying section 382, an amplifying section 384, a waveguide 386, a controlled light source 388, a waveguide 390, and a waveguide 392. The amplifying section 382 is formed on the arm 376 to amplify light. The amplifying section 384 is formed on the arm 380 to amplify light. The amplifying section 382 and the amplifying section 384 are SOAs. The arm 376 and the arm 380 are formed parallel to each other, and the coupler 374 and coupler 378 are formed respectively at the ends of the arms. The waveguide 372 is formed on the side of the coupler 374 opposite the arm 376 to sandwich the coupler 374. The waveguide 390 is formed on the side of the coupler 378 opposite the arm 376 to sandwich the coupler 378. The controlled light source 388 is formed on the end of the waveguide 390 opposite the coupler 378. The controlled light source 388 is a DFB laser, for example. The waveguide 392 is formed on the side of the coupler 374 opposite the arm 380 to sandwich the coupler 374. The waveguide 386 is formed on the side of the coupler 378 opposite the arm 380 to sandwich the coupler 378.

The amount of light input to the amplifying section 382 and the amplifying section 384 from the controlled light source 388 via the waveguide 390 and the coupler 378 is controlled by controlling the controlled light source 388. As a result, the gain of the amplifying section 382 and the amplifying section 384 can be controlled. By controlling the controlled light source 388 according to the intensity of the light input to the SOA 154, the non-linearity of the gain in the SOA 154 can be decreased, thereby also decreasing the PDG of the optical amplifier device 100.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An optical amplifier device comprising:
    an input/output section that inputs incident light and outputs emission light;
    a polarized light splitting section that causes a polarized light component of the incident light input from the input/output section to branch, and outputs first polarization mode light having a first polarization and second polarization mode light having a second polarization that is different from the first polarization;
    a polarization converting section into which is input the first polarization mode light, the polarization section converting the first polarization to the second polarization and outputting first polarization converted light; and
    an optical amplifying section that amplifies the first polarization converted light input to one end of a waveguide, outputs the resulting amplified first polarization converted light from another end of the waveguide, amplifies the second polarization mode light input to the other end of the waveguide, and outputs the resulting amplified second polarization mode light from the one end of the waveguide, wherein
    an absolute value of a change in gain per unit intensity of the light input to the optical amplifying section is no greater than 0.16 dB/dBm,
    the optical amplifying section includes:
        an active layer that propagates the first polarization converted light and the second polarization mode light; and
        an electrode that injects carriers into the active layer, and
    with $\Gamma$ representing a confinement coefficient that is a ratio between light confined in the active layer and light in the optical amplifying section and L representing length of the electrode in micrometers, the expression $\Gamma \times L < 1500\%$ μm is satisfied.

2. The optical amplifier device according to claim 1, wherein
    the optical amplifying section includes:
        a first semiconductor optical amplifier;
        a first waveguide that provides a connection between the one end of the optical amplifying section and the first semiconductor optical amplifier;
        a second semiconductor optical amplifier connected in series with the first semiconductor optical amplifier; and
        a second waveguide that provides a connection between the other end of the optical amplifying section and the second semiconductor optical amplifier, and
    the first waveguide and the second waveguide have the same optical length.

3. The optical amplifier device according to claim 2, wherein
    the polarized light splitting section includes a Mach-Zehnder interferometer circuit that is formed by a quartz planar lightwave circuit and has a waveguide with an embedded mesa structure, and
    a U-turn portion of an optical waveguide having a high mesa structure provides a connection between the first semiconductor optical amplifier and the second semiconductor optical amplifier.

4. The optical amplifier device according to claim 1, wherein
    the optical amplifying section includes a pair of light reflecting sections that reflect light, and
    the light reflected by the pair of light reflecting sections is resonated by the active layer.

5. The optical amplifier device according to claim 4, wherein
    the pair of light reflecting sections are formed on both sides of the active layer to sandwich the active layer, and reflect light in a direction perpendicular to a direction of the propagation of the first polarization converted light and the second polarization mode light in the active layer.

6. The optical amplifier device according to claim 4, wherein
    the pair of light reflecting sections are formed in contact with the active layer, and reflect light in a direction parallel to a direction of the propagation of the first polarization converted light and the second polarization mode light in the active layer.

7. The optical amplifier device according to claim 1, wherein
    the first polarization is TM polarization, and
    the second polarization is TE polarization.

* * * * *